(12) United States Patent
Castro et al.

(10) Patent No.: US 9,143,078 B2
(45) Date of Patent: Sep. 22, 2015

(54) POWER INVERTER INCLUDING SIC JFETS

(71) Applicant: Infineon Technologies AG, Neubiberg (DE)

(72) Inventors: Carlos Castro, Unterhaching (DE); Michael Mankel, Biedenkopf (DE); Mark N. Muenzer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 274 days.

(21) Appl. No.: 13/688,948

(22) Filed: Nov. 29, 2012

(65) Prior Publication Data

US 2014/0145664 A1    May 29, 2014

(51) Int. Cl.

| H02M 7/5387 | (2007.01) |
|---|---|
| H02P 27/06 | (2006.01) |
| H02M 7/5388 | (2007.01) |
| H02P 27/08 | (2006.01) |
| H03K 17/10 | (2006.01) |
| H02M 1/00 | (2007.01) |
| H03K 17/687 | (2006.01) |

(52) U.S. Cl.
CPC ............. *H02P 27/06* (2013.01); *H02M 7/5388* (2013.01); *H02P 27/08* (2013.01); *H03K 17/102* (2013.01); *B60L 2210/40* (2013.01); *H02M 2001/0054* (2013.01); *H02P 2207/01* (2013.01); *H03K 2017/6875* (2013.01); *Y02B 70/1483* (2013.01); *Y02B 70/1491* (2013.01); *Y02T 10/642* (2013.01); *Y02T 10/7241* (2013.01)

(58) Field of Classification Search
USPC ............. 318/400.26, 400.27, 400.28, 400.29, 318/800, 801; 363/13, 16, 17, 95, 97, 98, 363/131, 132; 327/423
See application file for complete search history.

(56) References Cited

U.S. PATENT DOCUMENTS

| 4,153,930 | A | 5/1979 | Marceau et al. |
|---|---|---|---|
| 4,675,544 | A | 6/1987 | Schrenk |
| 5,469,096 | A | 11/1995 | Nessi et al. |
| 6,040,561 | A * | 3/2000 | Murty ........................... 219/494 |
| 6,185,118 | B1 | 2/2001 | Sander et al. |
| 6,269,014 | B1 | 7/2001 | Sander et al. |

(Continued)

FOREIGN PATENT DOCUMENTS

| CA | 2 392 575 A1 | 2/2002 |
|---|---|---|
| WO | WO 2012/141859 A2 | 10/2012 |

OTHER PUBLICATIONS

Bergner, W., et al., "Infineon's 1200V SiC JFET—The New Way of Efficient and Reliable High Voltages Switching," Infineon Technologies Austria AG, 7 pages.

Berringer, K., "AC Motor Drive Using Integrated Power Stage," Motorola Semiconductor Application Note, AN1524/D, Rev. 1, 1996, 22 pages.

(Continued)

*Primary Examiner* — Bentsu Ro
(74) *Attorney, Agent, or Firm* — Slater & Matsil, L.L.P.

(57) ABSTRACT

A power inverter includes a reference line operably provided with a reference potential and a supply line operably provided with a DC supply voltage with respect to the reference potential. A first half bridge includes a high-side switch and a low-side switch. The high-side switch is coupled between the supply line and a middle tap of the half bridge and the low-side switch is coupled between the middle tap and the reference line. The low-side switch is formed by a normally-on silicon carbide junction field effect transistor and the high-side switch is formed by a series circuit of a normally-on silicon carbide junction field effect transistor and a normally-off metal oxide field effect transistor.

19 Claims, 3 Drawing Sheets

(56) References Cited

U.S. PATENT DOCUMENTS

| | | | |
|---|---|---|---|
| 7,551,004 | B2 | 6/2009 | Okazaki et al. |
| 7,602,228 | B2* | 10/2009 | Mazzola et al. .............. 327/423 |
| 7,872,888 | B2* | 1/2011 | Kuzumaki et al. .............. 363/98 |
| 8,134,327 | B2 | 3/2012 | Forte |
| 8,278,892 | B2 | 10/2012 | Friebe et al. |
| 2005/0184317 | A1* | 8/2005 | Hatakeyama et al. ........ 257/262 |
| 2008/0029906 | A1 | 2/2008 | Otremba |
| 2008/0290927 | A1 | 11/2008 | Mazzola et al. |
| 2009/0073729 | A1 | 3/2009 | Feldtkeller et al. |
| 2009/0201072 | A1 | 8/2009 | Honea et al. |
| 2011/0134675 | A1 | 6/2011 | Grbovic |
| 2012/0087167 | A1* | 4/2012 | Kuzumaki et al. ............ 363/131 |
| 2012/0262220 | A1 | 10/2012 | Springett |

OTHER PUBLICATIONS

Deboy, G., et al., "New SiC JFET Boost Performance of Solar Inverters," Power Electronics Europe, No. 4, 5 pages.

Domes, D., et al., "Cascode Light—normally-on JFET stand alone performance in a normally-off Cascode circuit," Infineon Technologies AG, 5 pages.

Köneke, T., et al., "Highly Efficient 12kVA Inverter with Natural Convection Cooling Using SiC Switches," PCIM Europe 2011, Nuremberg, Germany, 7 pages.

Siemieniec, R., et al., "The 1200V Direct-Driven SiC JFET power switch," Proceedings of the 2011—14th European Conference on Power Electronics and Applications (EPE 2011), Aug. 30, 2011-Sep. 1, 2011, 10 pages.

* cited by examiner

POWER INVERTER INCLUDING SIC JFETS

TECHNICAL FIELD

The present description relates to the field of power converters including silicon carbide junction field effect transistors (SiC-JFETs).

BACKGROUND

Silicon carbide (SiC) power switches are known for their low switching losses. For various reasons normally-on SiC-JFETs seem to be suitable for low loss unipolar switch applications. However, for safety reasons a normally-off behavior is usually desired. Therefore, normally-on high voltage SiC-JFETs were combined with standard low-voltage MOSFETs thus forming a normally-off cascode circuit which is, for example, described in D. Domes, X. Zhang: "CASCODE LIGHT—normally-on JFET stand alone performance in a normally-off Cascode circuit," in: Proceedings of PCIM 2010, Nuremberg, May 2010.

The mentioned cascode circuits may be used in power converters to high-voltage convert DC power into (e.g., multiphase) AC power. Most applications use a 3-phase power converter (also referred to as 3-phase inverter) which is composed of three half-bridge circuits coupled in parallel. Such power converters may be usefully applied, for example, to drive synchronous or asynchronous electric motors, particularly in hybrid or electric vehicles.

Replacing each single normally-on SiC-JFET with a respective cascode circuit will, however, result in higher losses. Thus their remains a need for an improved power converter.

SUMMARY OF THE INVENTION

A power inverter is described. In accordance with one example of the invention the power inverter comprises a reference line operably provided with a reference potential, a supply line operably provided with a DC supply voltage with respect to the reference potential, and at least one half bridge. The half bridge is composed of a high-side switch, which is coupled between the supply line and a middle tap of the half bridge, and a low-side switch, which is coupled between the middle tap and the reference line. The low side switch is formed by a normally-on silicon carbide (SiC) junction field effect transistor (JFET), and the high side switch formed by a series circuit of a normally-on SiC-JFET and a normally-off metal oxide field effect transistor (MOSFET).

Furthermore, a controller for driving and controlling a three-phase electric motor is described. The controller includes a power inverter as mentioned above.

BRIEF DESCRIPTION OF THE DRAWINGS

The invention can be better understood with reference to the following drawings and descriptions. The components in the figures are not necessarily to scale, instead emphasis is placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
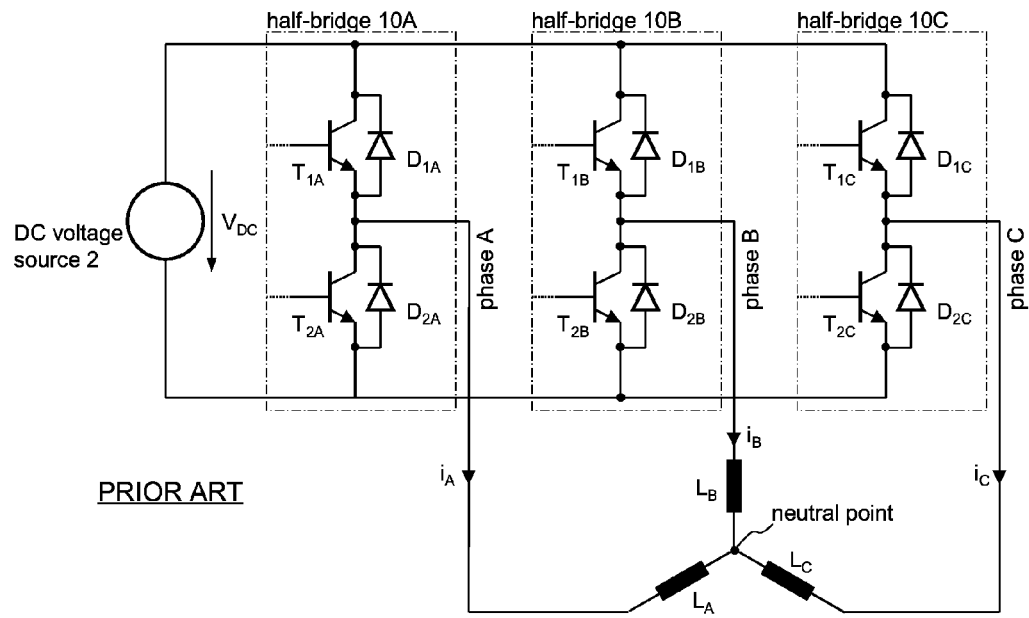
FIG. 1 illustrates a motor controller with a three-phase DC-to-AC power converter including three half bridges, each half bridge including a low-side and a high-side transistor.

FIG. 1 illustrates the power stage of a three-phase power inverter which may be used for driving and controlling three-phase AC motors (i.e., asynchronous motors or synchronous motors). In the present example the motor is illustrates as inductive loads $L_A$, $L_B$, and $L_C$ connected to form a Y-connection. The common terminal of the three inductive loads is usually referred to as neutral point, which may be floating in case of a symmetric load. The remaining terminals (i.e., which are not connected to the neutral point) of the inductive loads $L_A$, $L_B$, and $L_C$ form the external motor terminals to be connected to the three inverter outputs, labeled as "phase A," "phase B" and "phase C." Alternatively, the inductive loads could be connected in a delta-connection dependent on the requirements of the application.

The power inverter of FIG. 1 includes three half bridges 10A, 10B, 10C. Each half bridge is connected between a DC supply line and a reference line connected to a first and, respectively, a second terminal of a DC voltage supply 2. That is, a DC voltage $V_{DC}$ is applied between the DC supply line and the reference line during operation. Furthermore, each half bridge 10A, 10B, 10C is composed of a high side semiconductor switch $T_{1A}$, $T_{1B}$, $T_{1C}$ and a corresponding low side switch $T_{2A}$, $T_{2B}$, $T_{2C}$. Within each half bridge the load current paths (i.e., the collector-emitter current path in case of a bipolar transistor or the drain-source current path in case of a field effect transistor) of the low side switch and the high side switch are connected in series and the common circuit node (i.e., the center tap) of the two switches forms the bridge output terminal. The three output terminals of the three half bridges 10A, 10B, and 10C are labeled as "phase A," "phase B" and "phase C," respectively. For driving and controlling an inductive load semiconductor switch (transistor) $T_{1A}$, $T_{2A}$, $T_{1B}$, $T_{2B}$, $T_{1C}$ $T_{2C}$ has a freewheeling diode coupled in parallel to its load current path. Some types of semiconductor switches have an intrinsic freewheeling diode whereas some require an externally connected free-wheeling diode. The semiconductor switches are switched on and off by appropriately driving the control (i.e., gate or base) electrodes of the switches in such a manner that the inductive loads $L_A$, $L_B$, and $L_C$ carry (approximately) sinusoidal currents $i_A$, $i_B$, $i_C$ (phase currents) wherein the phase currents have a mutual phase shift of 120 degree.

Figure 2:
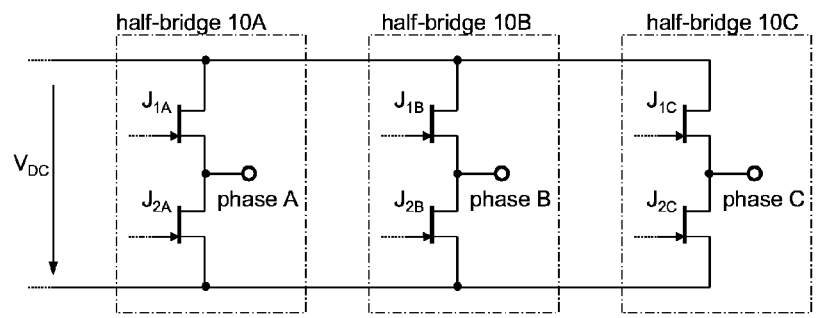
FIG. 2 illustrates a three-phase power inverter including three transistor half bridges, each half bridge being composed of a low-side and a high-side normally-on SiC-JFET.

FIG. 2 illustrates a three-phase power inverter similar to the inverter of FIG. 1. Different from the example of FIG. 1 the inverter of FIG. 2 is composed of normally-on silicon carbide (SiC) junction field effect transistors (JFETs). SiC-JFETs usually have some advantages over MOSFETS when switching high electric power. SiC-JFETs may operate at high temperatures and are available for reverse voltages up to 1.2 kilovolts (kV). Furthermore, SiC-JFETs have a better performance in terms of switching losses than comparable MOSFETs. As SiC-JFETs are normally-on devices (and thus have to be actively switched off) some security issues arise that require complicated gate driver circuits to avoid a half bridge shoot-through (i.e., a short circuit of the DC voltage $V_{DC}$ due to a simultaneous switch on of the low-side and the high-side switch of a half-bridge). Generally, a normally-off switching behavior would be desirable.

Figure 3:
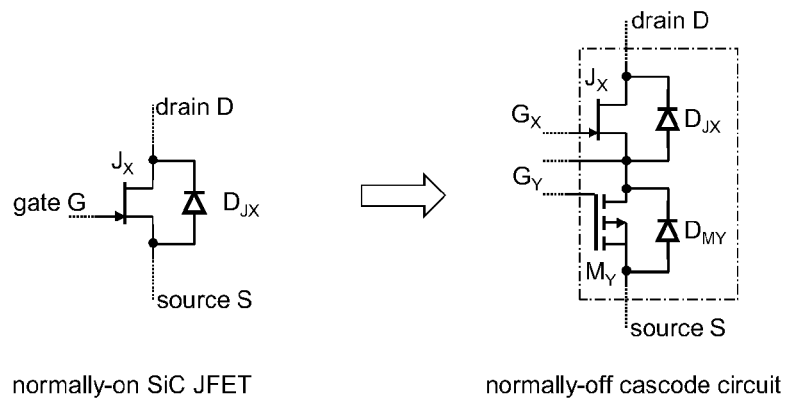
FIG. 3 illustrates the replacement of a normally-on SiC-JFET by a series circuit of a high-voltage normally-on SiC-JFET and a low-voltage normally-off MOSFET, the series circuit having a normally-off behavior.

In order to avoid the disadvantages of the normally-on behavior of SiC-JFETs, a normally-on high-voltage SiC-JFET is combined with standard low-voltage MOSFET thus forming a series circuit which exhibits a normally-off behavior. This series circuit may be designed as a so-called "cascode circuit." FIG. 3 illustrates substitution of a high-voltage SiC-JFET $J_X$ by a series circuit of a high-voltage SiC-JFET $J_X$ and a low-voltage MOSFET $M_Y$, wherein the source of the JFET $J_X$ is directly connected to the drain of the MOSFET $M_Y$. The gate $G_X$ of the JFET $J_X$ may be connected to the source S of the MOSFET. However, this is not the only option and more sophisticated circuits can be used to drive the gate of the JFET $J_X$. In most applications the JFETs and the MOSFETs will have freewheeling diodes coupled parallel to their load current paths. Generally, the cascade structure of FIG. 3 has the advantage (as compared to a single SiC-JFET) that it has a normally-off characteristic. However, losses are higher (as compared to a single SiC-JFET) due to the additional conduction losses in the low-voltage MOSFET.

Figure 4:
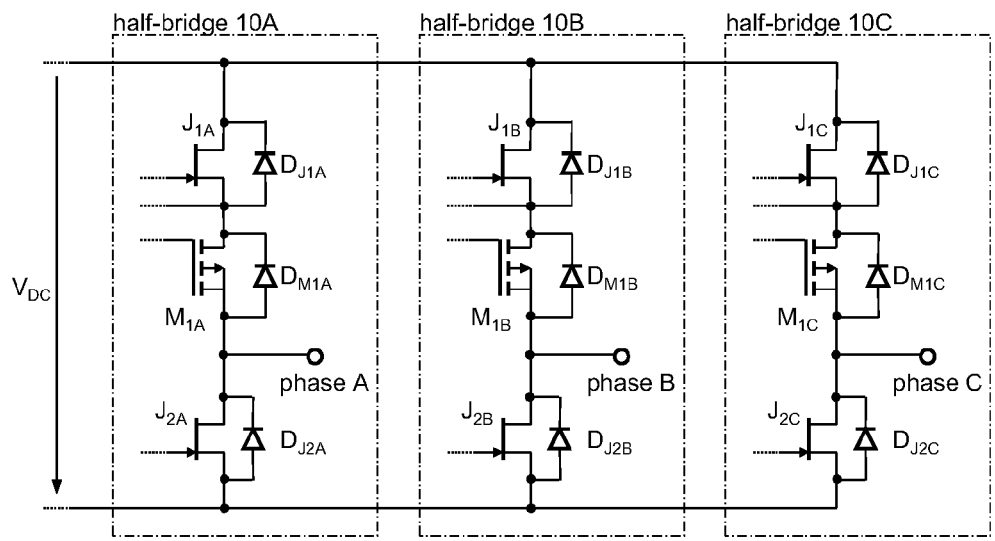
FIG. 4 illustrates a three-phase power inverter including three transistor half bridges, each half bridge being composed of a low-side normally-on SiC-JFET and a normally-off high-side switch, which is formed by a series circuit of a high-voltage normally-on SiC-JFET and a low-voltage normally-off MOSFET.

FIG. 4 illustrates one exemplary embodiment of a three-phase power inverter in accordance with the present invention. Accordingly, the power inverter includes three half bridges 10A, 10B, and 10C which are connected between a DC supply line and a reference line. The DC supply line is provided with a DC supply voltage and the reference line is coupled to a reference potential. Thus, the voltage drop from the supply line to the reference line is equal to the supply voltage $V_{DC}$. Each half bridge is composed of a high-side switch, which is coupled between the supply line and a middle tap (center tap) of the half bridge, and a low-side switch, which is coupled between the middle tap and the reference line. The low-side switch is formed by a single normally-on SiC-JFET, and the high side switch formed by a series circuit of another normally-on SiC-JFET and a normally-off metal oxide field effect transistor (MOSFET). This series circuit corresponds with the circuit illustrated in the right circuit diagram of FIG. 3 and is also referred to as cascode circuit. The SiC-JFETs are high-voltage transistors with maximum reverse voltages of at least 400 volts and up to 1.2 kilovolts and more. The MOSFETs are low-voltage transistors with maximum reverse voltages below 30 volts. MOSFETs with such low maximum reverse voltages introduce very little additional conduction losses into the load current path.

Figure 5:
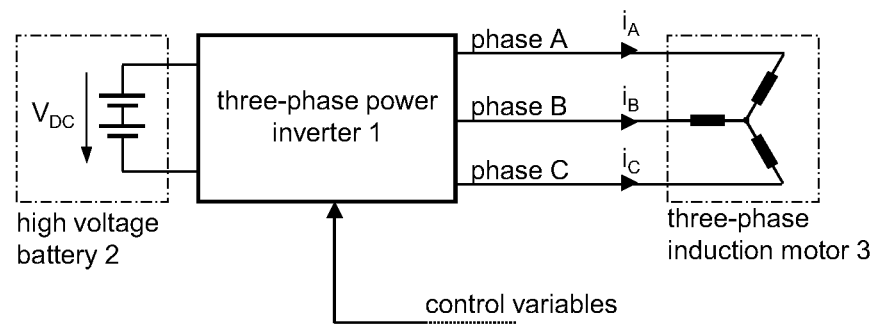
FIG. 5 illustrates the power train of an electric vehicle including a high voltage battery, a three-phase power inverter, and a three-phase induction motor (asynchronous motor).

FIG. 5 illustrates one example of an application of the power inverter of FIG. 4, i.e., the power train of an electric vehicle. The example of FIG. 5 includes a high-voltage battery 2 as nowadays commonly used in hybrid or electric vehicles. The DC voltage $V_{DC}$ provided by the battery is supplied to a power inverter 1 which may include a power stage as shown in FIG. 4. That is, the power inverter 1 is composed of three half-bridges. The three output terminals (phase A, phase B, phase C, see FIG. 4) are connected, for example, to the three terminals of a three-phase induction motor 3. The transistors of the power inverter 1 may be driven using appropriate gate driver circuits which are operated such that the motor currents $i_A$, $i_B$, and $i_C$ match corresponding desired current signals. The current control usually depends on various control variables, such as the desired rotational speed of the motor.

Although exemplary embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power inverter comprising:
    a reference line operably provided with a reference potential;
    a supply line operably provided with a DC supply voltage with respect to the reference potential, the supply line being connected to a first terminal of a DC voltage supply and the reference line being directly connected to a second terminal of a DC voltage supply;
    a first half bridge comprising a high-side switch and a low-side switch, the high-side switch coupled between the supply line and a middle tap of the half bridge and the low-side switch directly connected between the middle tap and the reference line;
    wherein the low-side switch is formed by a normally-on silicon carbide (SiC) junction field effect transistor (JFET); and
    wherein the high-side switch is formed by a series circuit of a normally-on SiC JFET and a normally-off metal oxide field effect transistor (MOSFET).

2. The power inverter of claim 1, wherein the SiC JFET is a high voltage transistors and the MOSFET is a low voltage transistor.

3. The power inverter of claim 2, wherein the SiC JFET has a maximum reverse voltage of more than 400 volts and the MOSFET has a maximum reverse voltage of less than 50 volts.

4. The power inverter of claim 1 further comprising:
    a second and a third half bridge each comprising a high-side switch and a low-side switch, wherein for both the second and third half bridges the high-side switch is coupled between the supply line and a middle tap of the respective half bridge and the low-side switch is coupled between the middle tap and the reference line;
    wherein each low-side switch is formed by a single normally-on SiC-JFET; and
    wherein each high-side switch is formed by a series circuit of a normally-on SiC-JFET and a normally-off MOSFET.

5. The power inverter of claim 4, wherein each SiC-JFET is a high voltage transistors and the MOSFET is a low voltage transistor.

6. The power inverter of claim 5, wherein each SiC-JFET has a maximum reverse voltage of more than 400 volts and each MOSFET has a maximum reverse voltage of less than 50 volts.

7. The power inverter of claim 1, wherein the DC voltage supply is a high voltage battery.

8. A controller for driving and controlling a three-phase electric motor, the controller comprising:
    a reference line operably provided with a reference potential;
    a supply line operably provided with a DC supply voltage with respect to the reference potential, the supply line being connected to a first terminal of a DC voltage supply and the reference line being directly connected to a second terminal of a DC voltage supply;

a first half bridge comprising a first high-side switch and a first low-side switch, the first high-side switch coupled between the supply line and a first middle tap of the first half bridge and the first low-side switch directly connected between the first middle tap and the reference line, wherein the first low-side switch is formed by a single normally-on silicon carbide (SiC) junction field effect transistor (JFET) and the first high-side switch is formed by a series circuit of a normally-on SiC JFET and a normally-off metal oxide field effect transistor (MOSFET);

a second half bridge comprising a second high-side switch and a second low-side switch, the second high-side switch coupled between the supply line and a second middle tap of the second half bridge and the second low-side switch directly connected between the second middle tap and the reference line, wherein the second low-side switch is formed by a single normally-on SiC JFET and the second high-side switch is formed by a series circuit of a normally-on SiC JFET and a normally-off MOSFET; and a third half bridge comprising a third high-side switch and a third low-side switch, the third high-side switch coupled between the supply line and a third middle tap of the third half bridge and the third low-side switch directly connected between the third middle tap and the reference line, wherein the third low-side switch is formed by a single normally-on SiC JFET and the third high-side switch is formed by a series circuit of a normally-on SiC JFET and a normally-off MOSFET;

wherein the middle taps of the first, second and third half bridges are configured to be operably coupled to the three-phase electric motor for providing load current to the motor.

9. The controller of claim 8, wherein the SiC JFETs are high voltage transistors and the MOSFET is a low voltage transistor.

10. The controller of claim 9, wherein the SiC JFETs have a maximum reverse voltage of more than 400 volts and the MOSFETs have a maximum reverse voltage of less than 50 volts.

11. The controller of claim 8, further comprising a driver circuit with outputs coupled to control terminals of each of the SiC JFETs and MOSFETs.

12. A power train for a vehicle, the power train comprising:

a high-voltage battery having a first terminal connected to a supply line and a second terminal directly connected to a reference line; the high voltage battery providing a DC supply voltage between the supply line and the reference line;

a first half bridge comprising a first high-side switch and a first low-side switch, the first high-side switch coupled between the high-voltage battery and a first middle tap of the first half bridge and the first low-side switch directly connected between the first middle tap and the reference line, wherein the first low-side switch is formed by a single normally-on silicon carbide (SiC) junction field effect transistor (JFET) and the first high-side switch is formed by a series circuit of a normally-on SiC JFET and a normally-off metal oxide field effect transistor (MOSFET);

a second half bridge comprising a second high-side switch and a second low-side switch, the second high-side switch coupled between the high-voltage battery and a second middle tap of the second half bridge and the second low-side switch directly connected between the second middle tap and the reference line, wherein the second low-side switch is formed by a single normally-on SiC JFET and the second high-side switch is formed by a series circuit of a normally-on SiC JFET and a normally-off MOSFET;

a third half bridge comprising a third high-side switch and a third low-side switch, the third high-side switch coupled between the high-voltage battery and a third middle tap of the third half bridge and the third low-side switch directly connected between the third middle tap and the reference line, wherein the third low-side switch is formed by a single normally-on SiC JFET and the third high-side switch is formed by a series circuit of a normally-on SiC JFET and a normally-off MOSFET; and a three-phase electric motor, wherein the middle taps of the first, second and third half bridges are operably coupled to the three-phase electric motor for providing load current to the motor.

13. The power train of claim 12, wherein the SiC JFETs are high voltage transistors and the MOSFET is a low voltage transistor.

14. The power train of claim 13, wherein the SiC JFETs have a maximum reverse voltage of more than 400 volts and the MOSFETs have a maximum reverse voltage of less than 50 volts.

15. The power train of claim 12, wherein the vehicle comprises a hybrid vehicle.

16. The power train of claim 12, wherein the vehicle comprises an electric vehicle.

17. The power train of claim 12, further comprising a driver circuit with outputs coupled to control terminals of each of the SiC JFETs and MOSFETs.

18. The power train of claim 17, wherein the driver circuit is configured to cause motor currents to be controlled by control variables.

19. The power train of claim 18, wherein the control variables comprise rotational speed of the motor.

* * * * *